United States Patent
Lim et al.

(10) Patent No.: US 9,337,808 B2
(45) Date of Patent: May 10, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventors: Hee Joon Lim, Cheongju-si (KR); Sang Ah Hyun, Cheongju-si (KR)

(73) Assignee: SK HYNIX INC., Incheon-Si (KR)

( * ) Notice: Subject to any disclaimer, the term of this patent is extended or adjusted under 35 U.S.C. 154(b) by 130 days.

(21) Appl. No.: 14/468,475

(22) Filed: Aug. 26, 2014

(65) Prior Publication Data
US 2015/0256153 A1  Sep. 10, 2015

(30) Foreign Application Priority Data
Mar. 5, 2014  (KR) ........................ 10-2014-0025844

(51) Int. Cl.
| | |
|---|---|
| *H01L 35/00* | (2006.01) |
| *H03K 3/012* | (2006.01) |
| *G11C 7/04* | (2006.01) |
| *G11C 5/14* | (2006.01) |
| *G11C 7/10* | (2006.01) |

(52) U.S. Cl.
CPC ............ *H03K 3/012* (2013.01); *G11C 5/147* (2013.01); *G11C 7/04* (2013.01); *G11C 7/1063* (2013.01)

(58) Field of Classification Search
CPC .......... H03K 3/011; H03K 3/012; G01K 7/16
USPC ......... 327/512, 513, 108–112, 427, 434, 437; 326/82, 83
See application file for complete search history.

(56) References Cited

U.S. PATENT DOCUMENTS

| 7,451,053 | B2* | 11/2008 | Jeong | G11C 5/147 324/750.03 |
|---|---|---|---|---|
| 7,532,056 | B2* | 5/2009 | Seo | G01K 7/00 323/907 |
| 7,579,898 | B2* | 8/2009 | Soldera | G01K 7/015 327/512 |
| 8,901,992 | B1* | 12/2014 | Lim | G05F 1/465 327/512 |
| 2004/0239404 | A1* | 12/2004 | Behzad | G05F 3/262 327/512 |
| 2008/0061864 | A1* | 3/2008 | Oberhuber | G05F 3/30 327/512 |
| 2013/0242674 | A1 | 9/2013 | Furutani et al. | |
| 2015/0211939 | A1* | 7/2015 | Hyun | G01K 7/16 374/183 |

FOREIGN PATENT DOCUMENTS

KR  1020070115139 A  12/2007

* cited by examiner

*Primary Examiner* — Lincoln Donovan
*Assistant Examiner* — Thomas Skibinski
(74) *Attorney, Agent, or Firm* — William Park & Associates Ltd.

(57) ABSTRACT

A semiconductor system includes a controller and a semiconductor device. The controller receives a temperature code signal and responsively generates a mode set signal operable to adjust a level variation and a voltage variation rate of a temperature voltage signal, wherein the temperature voltage signal level varies according to temperature when a logic level combination of the temperature code signal is different from a predefined logic level combination. The semiconductor device generates the temperature voltage signal from a drivability and a resistance value set by the mode set signal. The semiconductor device generates the temperature code signal based on a comparison of the temperature voltage signal and a reference voltage signal.

20 Claims, 7 Drawing Sheets

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-0025844, filed on Mar. 5, 2014, in the Korean Intellectual Property Office, which is incorporated herein by reference in its entirety as set forth in full.

BACKGROUND

1. Technical Field

Embodiments relate to semiconductor devices and semiconductor systems including the same.

2. Related Art

In the electronics industry, the development of higher performance electronic systems, such as for example personal computers and communication systems, have led in an increase in demand for relatively highly integrated fast volatile memory devices. An example of such a memory device is a dynamic random access memory (DRAM) device. Semiconductor devices, such as the DRAM devices, that are used in cellular phones or notebook computers are typically designed to have a relatively low power consumption characteristic. Reducing an operation current and a standby current of the semiconductor devices may result in relatively lower power consumption.

Data retention characteristics of a DRAM cell including a single transistor and a single storage capacitor may be sensitive to variations in temperature. Operation conditions of internal circuit blocks in a semiconductor integrated circuit are often adjusted based on variations in circumferential temperature. For example, DRAM devices used in mobile systems may be designed to adjust a refresh cycle time based on variations in circumferential temperature. Temperature sensors, such as for example digital temperature sensor regulators (DTSRs) and analog temperature sensor regulators (ATSRs), have been widely used to adjust the operation conditions of semiconductor devices, such as DRAM devices, based on variations in the circumferential temperature. Such temperature sensors may be used to detect a relatively high temperature and responsively adjust an operation cycle time in an attempt to reduce power consumption in a self-refresh mode. The temperature sensors may be used to monitor circumferential temperatures in a normal operation mode.

SUMMARY

In an embodiment, a semiconductor system includes a controller and a semiconductor device. The controller receives a temperature code signal and responsively generates a mode set signal operable to adjust a level variation and a voltage variation rate of a temperature voltage signal, wherein the temperature voltage signal level varies according to temperature when a logic level combination of the temperature code signal is different from a predefined logic level combination. The semiconductor device generates the temperature voltage signal from a drivability and a resistance value set by the mode set signal. The semiconductor device generates the temperature code signal based on a comparison of the temperature voltage signal and a reference voltage signal.

In an embodiment, a semiconductor device includes a temperature sensor, a code generator, a register and an output buffer. The temperature sensor receives a mode set signal operable to adjust a level variation and a voltage variation rate of a temperature voltage signal to generate the temperature voltage signal and generates the reference voltage signal having a relatively constant voltage level. The temperature voltage signal is generated by adjusting a drivability and a resistance value of the temperature sensor in response to the mode set signal. The code generator generates a code signal based on a comparison of the temperature voltage signal with the reference voltage signal. The register suitable stores the code signal and outputs the code signal as an internal code signal. The output buffer buffers the internal code signal and generates the buffered internal code signal as the temperature code signal. The level variation of the temperature voltage signal is adjusted based on the drivability of the temperature sensor, and the voltage variation rate of the temperature voltage signal is adjusted based on the resistance value of the temperature sensor.

DETAILED DESCRIPTION OF THE EMBODIMENTS

Various embodiments will be described hereinafter with reference to the accompanying drawings. The embodiments described herein are for illustrative purposes.

Figure 1:
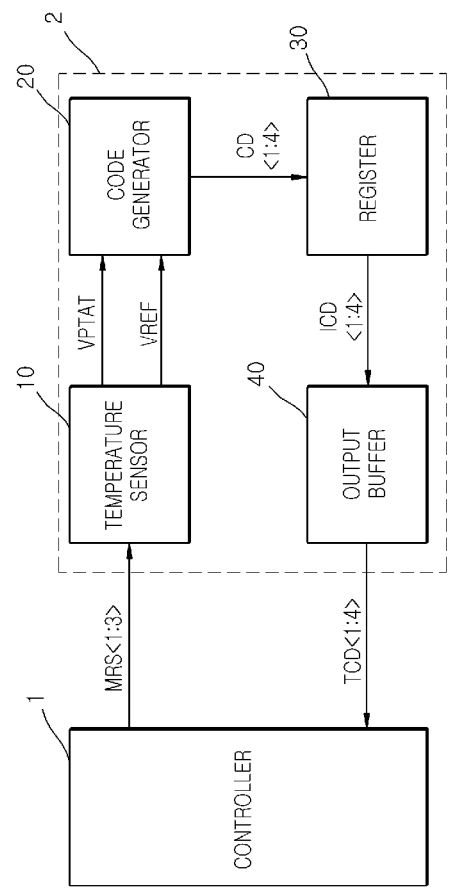
FIG. 1 is a block diagram representation of an embodiment of a semiconductor system.

Referring to FIG. 1, an embodiment of a semiconductor system may include a controller 1 and a semiconductor device 2.

The controller 1 may receive first, second, third and fourth temperature code signals TCD<1:4>. The controller 1 transmits first, second and third mode set signals MRS<1:3> for adjusting a level variation and a voltage variation rate of a temperature voltage signal VPTAT to the semiconductor device 2 when a logic level combination of the first, second, third and fourth temperature code signals TCD<1:4> is inconsistent with a predefined logic level combination. When the logic level combination of the first, second and third fourth temperature code signals TCD<1:4> is consistent with the predefined logic level combination, the controller 1 does not transmit the first, second and third mode set signals MRS<1:3> to the semiconductor device 2. The temperature voltage signal VPTAT may be a voltage signal where the level increases when temperature rises.

In an embodiment, the controller 1 may be electrically coupled to a plurality of semiconductor devices and may adjust a level variation and a voltage variation rate of the temperature voltage signal VPTAT associated with each of the plurality of semiconductor devices.

The semiconductor device 2 may include a temperature sensor 10, a code generator 20, a register 30 and an output buffer 40.

The temperature sensor 10 may adjust a drivability and a resistance value in response to the first, second and third mode set signals MRS<1:3> and may generate the temperature voltage signal VPTAT and a reference voltage signal VREF having a relatively constant voltage level. A level variation of the temperature voltage signal VPTAT may be adjusted based on a drivability of the temperature sensor 10, and a voltage variation rate of the temperature voltage signal VPTAT may be adjusted based on a resistance value of the temperature sensor 10.

The code generator 20 may receive the temperature voltage signal VPTAT and the reference voltage signal VREF from the temperature sensor 10. The code generator 20 may compare the received temperature voltage signal VPTAT with the received reference voltage signal VREF to generate first, second, third and fourth code signals CD<1:4>. The first, second, third and fourth code signals CD<1:4> may have four data bits. In alternative embodiments, the code signals may have five or more bits and may include temperature information.

The register 30 may store the first, second, third and fourth code signals CD<1:4> received from the code generator 20 and may output the first, second, third and fourth code signals CD<1:4> as first, second, third and fourth internal code signals ICD<1:4>, respectively. The register 30 may be implemented using a plurality of flip-flops or using a plurality of latches to store multi-bit data.

The output buffer 40 may include a plurality of pads. The output buffer may buffer the first, second, third and fourth internal code signals ICD<1:4> received from the register 30 and output the buffered first, second, third and fourth internal code signals ICD<1:4> as the first, second, third and fourth temperature code signals TCD<1:4>, respectively.

As described above, the semiconductor device 2 may generate the temperature voltage signal VPTAT in response to the first, second and third mode set signals MRS<1:3> and may compare the temperature voltage signal VPTAT with the reference voltage signal VREF to generate and output the first, second, third and fourth temperature code signals TCD<1:4>.

Figure 2:
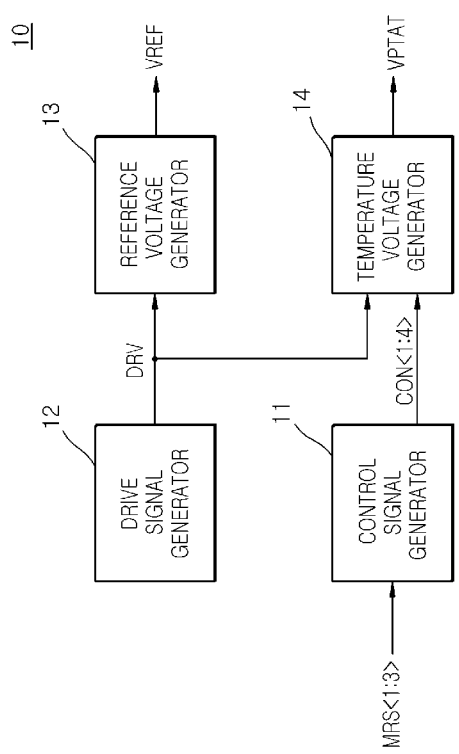
FIG. 2 is a block diagram representation of an example of a temperature sensor in the semiconductor system of FIG. 1.

Referring to FIG. 2, the temperature sensor 10 may be configured to include a control signal generator 11, a drive signal generator 12, a reference voltage generator 13 and a temperature voltage generator 14.

The control signal generator 11 may decode the first, second and third mode set signals MRS<1:3> received from the controller 1 to generate first, second, third and fourth control signals CON<1:4>. The first and second mode set signals MRS<1:2> may be set to adjust a level variation of the temperature voltage signal VPTAT, and the third mode set signal MRS<3> may be set to adjust a voltage variation rate of the temperature voltage signal VPTAT. The first, second and third mode set signals MRS<1:3> may be generated to have three data bits. In alternative embodiments, the mode set signals may be generated to have four or more data bits to adjust a level variation and a voltage variation rate of the temperature voltage signal VPTAT.

The drive signal generator 12 may generate a drive signal DRV having a constant level regardless of temperature variation.

The reference voltage generator 13 may receive the drive signal DRV to generate the reference voltage signal VREF having a relatively constant level.

The temperature voltage generator 14 may adjust a drivability and a resistance value in response to the drive signal DRV and to the first, second, third and fourth control signals CON<1:4> to generate the temperature voltage signal VPTAT.

Figure 3:
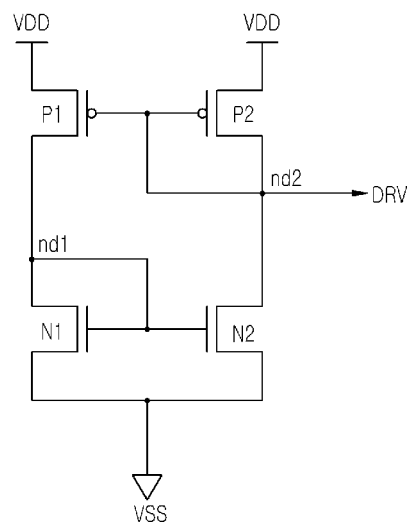
FIG. 3 is a circuit diagram representation of an example of a drive signal generator in the temperature sensor of FIG. 2.

Referring to FIG. 3, the drive signal generator 12 may include two PMOS transistors P1, P2 and two NMOS transistors N1, N2. The PMOS transistor P1 is electrically coupled to a power supply voltage VDD terminal and to a node ND1. The PMOS transistor P2 is electrically coupled to the power supply voltage VDD terminal and to a node ND2. The drive signal DRV is output via the node ND2. The NMOS transistor N1 is electrically coupled to the node ND1 and to a ground voltage VSS terminal. The NMOS transistor N2 is electrically coupled to the node ND2 and to the ground voltage VSS terminal. The PMOS transistor P1 may be configured to receive the voltage signal at the node ND2 via a gate of the PMOS transistor P1 and may supply electric charge from the power supply voltage VDD terminal to the node ND1. The PMOS transistor P2 may be configured to receive the voltage signal at the node ND2 via a gate of the PMOS transistor P2 and to supply electric charge from the power supply voltage VDD terminal to the node ND2. The NMOS transistor N1 may be configured to receive a voltage signal at the node ND1 via a gate of the NMOS transistor N1 to discharge electric charge of the node ND1 to the ground voltage VSS terminal. The NMOS transistor N2 may be configured to receive the voltage signal at the node ND1 via a gate of the NMOS transistor N2 to discharge electric charges of the node ND2 to the ground voltage VSS terminal. The drive signal generator 12 may generate the drive signal DRV having a relatively constant level regardless of temperature variation. The drive signal generator 12 may be implemented using a circuit configured to generate a relatively constant voltage regardless of temperature variation. For example, the drive signal generator 12 may be implemented using a Widlar circuit or a band gap voltage generation circuit.

Figure 4:
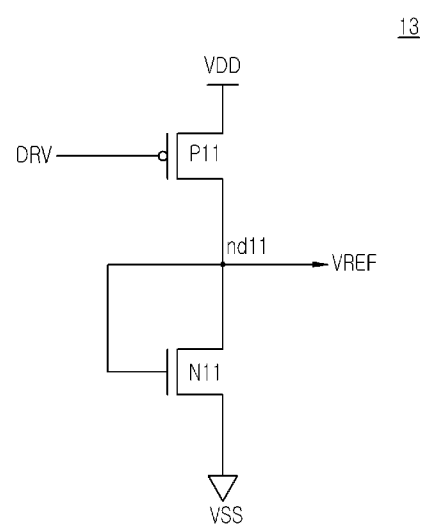
FIG. 4 is a circuit diagram representation of an example of a reference voltage generator in the temperature sensor of FIG. 2.

Referring to FIG. 4, the reference voltage generator 13 may include a PMOS transistor P11 and an NMOS transistor N11. The PMOS transistor P11 is electrically coupled to the power supply voltage VDD terminal and to a node ND11. The node ND11 outputs the reference voltage signal VREF. The NMOS transistor N11 is electrically coupled to the node ND11 and to the ground voltage VSS terminal. The PMOS transistor P11 may supply electric charge from the power supply voltage VDD terminal to the node ND11 based on a level of the drive signal DRV. The NMOS transistor N11 may be configured to receive a voltage signal of the node ND11 via a gate of the NMOS transistor N11 and may be turned on in response to the voltage signal at the node ND11. The NMOS transistor N11 may be implemented using a diode-like transistor having a gate of the diode-like transistor electrically coupled to a drain of the diode-like transistor. A drain current of the NMOS transistor N11 may have a relatively constant level regardless of temperature variation. The reference voltage generator 13 may generate the reference voltage signal VREF having a relatively constant level regardless of temperature variation.

Figure 5:
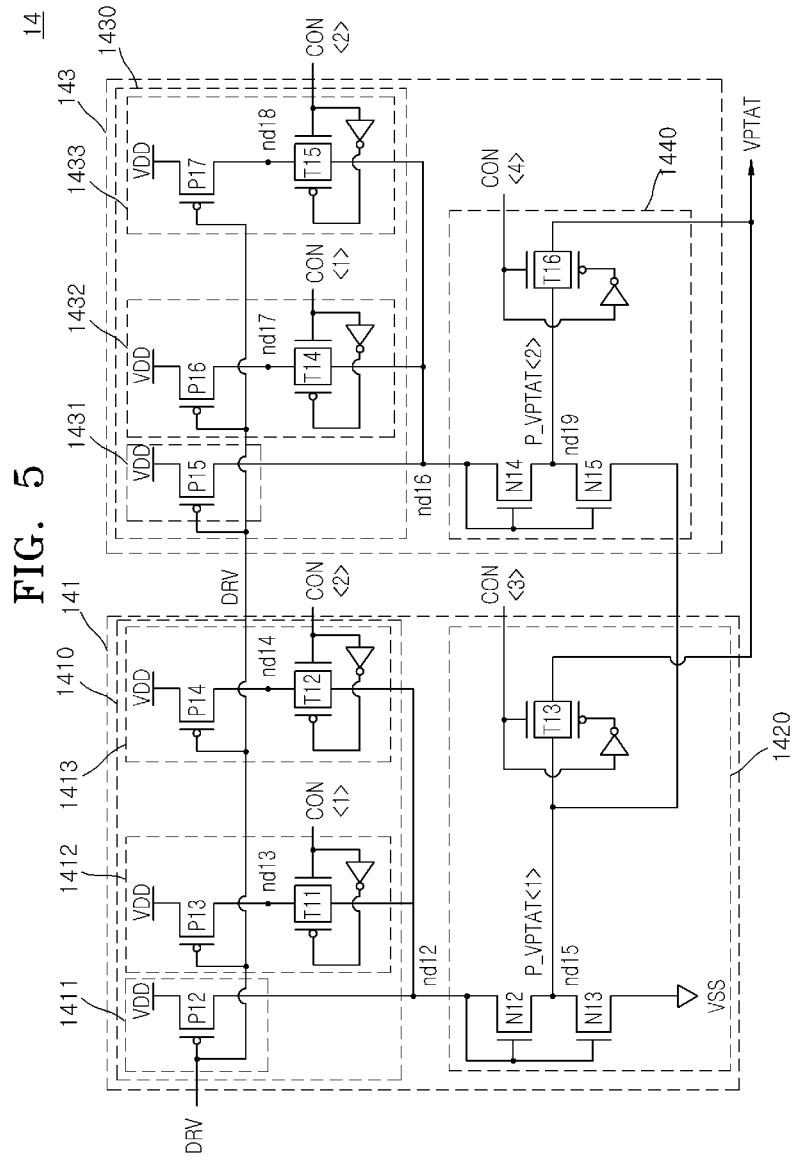
FIG. 5 is a circuit diagram representation of an example of a temperature voltage generator in the temperature sensor of FIG. 2.

Referring to FIG. 5, the temperature voltage generator 14 may include a first pre-temperature voltage generator 141 and a second pre-temperature voltage generator 143.

The first pre-temperature voltage generator 141 may include a first pull-up driver 1410 and a first resistance controller 1420. The first pull-up driver 1410 may control a drivability thereof in response to the first and second control signals CON<1:2> to pull up a node ND12. The first resistance controller 1420 may generate a first pre-temperature voltage signal P_VPTAT<1>. The voltage level of the first pre-temperature voltage signal P_VPTAT<1> is divided by the resistance values of a first temperature element N12 and a second temperature element N13. The first temperature element N12 and the second temperature element N13 are electrically coupled in series between the node ND12 and the ground voltage VSS terminal. The first resistance controller 1420 may generate the first pre-temperature voltage signal P_VPTAT<1> as the temperature voltage signal VPTAT when the third control signal CON<3> is enabled.

The first pull-up driver 1410 may include a first driver 1411, a second driver 1412 and a third driver 1413.

The first driver 1411 may be configured to include a PMOS transistor P12. The PMOS transistor P12 is electrically coupled to the power supply voltage VDD terminal and to the node ND12 and operates to pull up the node ND12 based on a level of the drive signal DRV.

The second driver 1412 may be configured to include a PMOS transistor P13. The PMOS transistor P13 is electrically coupled to the power supply voltage VDD terminal and to a node ND13 and operates to pull up the node ND13 based on a level of the drive signal DRV and a transfer gate T11. The transfer gate T11 is electrically couples the node ND13 to the node ND12 when the first control signal CON<1> is enabled. An enabled first control signal CON<1> has a logic "high" level. The second driver 1412 may operate to pull up the node ND12 when the first control signal CON<1> is enabled to have a logic "high" level.

The third driver 1413 may be configured to include a PMOS transistor P14. The PMOS transistor P14 is electrically coupled to the power supply voltage VDD terminal and to a node ND14 and operates to pull up the node ND14 based on a level of the drive signal DRV and a transfer gate T12. The transfer gate electrically couples the node ND14 to the node ND12 when the second control signal CON<2> is enabled. An enabled second control signal CON<2> has a logic "high" level. The third driver 1413 may operate to pull up the node ND12 when the second control signal CON<2> is enabled to have a logic "high" level.

The first pull-up driver 1410 may be configured such that a drivability of the second driver 1412 for pulling up the node ND12 when the first control signal CON<1> is enabled is less than a drivability of the third driver 1413 for pulling up the node ND12 when the second control signal CON<2> is enabled.

The first resistance controller 1420 may include the first temperature element N12. The first temperature element N12 is electrically coupled to the node ND12 and to a node ND15. The first pre-temperature voltage signal P_VPTAT<1> is output via the node ND15. The second temperature element N13 is electrically coupled to the node ND15 and to the ground voltage VSS terminal. A first switch element T13 is electrically coupled to the node ND15. The first temperature element N12 may be an NMOS transistor that is configured to receive a voltage signal of the node ND12 via a gate of the NMOS transistor and is turned on in response to the voltage signal of the node ND12. The second temperature element N13 may be an NMOS transistor that is configured to receive a voltage signal of the node ND12 via a gate of the NMOS transistor and is turned on in response to the voltage signal of the node ND12. The first switch element T13 may be a transfer gate that is configured to output the first pre-temperature voltage signal P_VPTAT<1> as the temperature voltage signal VPTAT when the third control signal CON<3> is enabled. An enabled third control signal CON<3> has a logic "high" level. The first temperature element N12 may be a diode-like NMOS transistor where the gate of the diode-like NMOS transistor is electrically coupled to the drain of the diode-like NMOS transistor. The second temperature element N13 may be an NMOS transistor having a gate that is electrically coupled to the node ND12. The drain currents of the first and second temperature elements N12, N13 may increase or decrease as the temperature rises.

The second pre-temperature voltage generator 143 may include a second pull-up driver 1430 and a second resistance controller 1440. The second pull-up driver 1430 may control a drivability thereof in response to the first and second control signals CON<1:2> to pull up a node ND16. The second resistance controller 1440 may generate a second pre-temperature voltage signal P_VPTAT<2>. The voltage level of the second pre-temperature voltage signal P_VPTAT<2> is divided by the resistance values of a third temperature element N14 and a fourth temperature element N15. The third temperature element N14 and a fourth temperature element N15 are electrically coupled in series between the node ND16 and the node ND15. The second resistance controller 1440 may generate the second pre-temperature voltage signal P_VPTAT<2> as the temperature voltage signal VPTAT when the fourth control signal CON<4> is enabled.

The second pull-up driver 1430 may include a fourth driver 1431, a fifth driver 1432 and a sixth driver 1433.

The fourth driver 1431 may be configured to include a PMOS transistor P15. The PMOS transistor P15 is electrically coupled to the power supply voltage VDD terminal and to the node ND16 and operates to pull up the node ND16 based on a level of the drive signal DRV.

The fifth driver 1432 may be configured to include a PMOS transistor P16. The PMOS transistor P16 is electrically coupled to the power supply voltage VDD terminal and to a node ND17 and operates to pull up the node ND17 based on a level of the drive signal DRV and a transfer gate T14. The transfer gate T14 electrically couples the node ND17 to the node ND16 when the first control signal CON<1> is enabled. An enabled first control signal CON<1> has a logic "high" level. The fifth driver 1432 may pull up the node ND16 when the first control signal CON<1> is enabled to have a logic "high" level.

The sixth driver 1433 may be configured to include a PMOS transistor P17. The PMOS transistor is electrically coupled to the power supply voltage VDD terminal and to a node ND18 and operates to pull up the node ND18 based on a level of the drive signal DRV and a transfer gate T15. The transfer gate T15 electrically couples the node ND18 to the node ND16 when the second control signal CON<2> is enabled. An enabled second control signal CON<2> has a logic "high" level. The sixth driver 1433 may pull up the node ND16 when the second control signal CON<2> is enabled to have a logic "high" level.

The second pull-up driver 1430 may be configured such that a drivability of the fifth driver 1432 for pulling up the node ND16 when the first control signal CON<1> is enabled is less than a drivability of the sixth driver 1433 for pulling up the node ND16 when the second control signal CON<2> is enabled.

The second resistance controller 1440 may include the third temperature element N14. The third temperature element N14 is electrically coupled to the node ND16 and to a node ND19. The second pre-temperature voltage signal P_VPTAT<2> is output via the node ND19. The fourth temperature element N15 is electrically coupled to the node ND19 and to the node ND15. The node ND15 outputs the first pre-temperature voltage signal P_VPTAT<1>. A second switch element T16 is electrically coupled to the node ND19. The third temperature element N14 may be an NMOS transistor that is configured to receive a voltage signal of the node ND16 via a gate of the NMOS transistor and is turned on in response to the voltage signal at the node ND16. The fourth temperature element N15 may be an NMOS transistor that is configured to receive a voltage signal of the node ND16 via a gate of the NMOS transistor and is turned on in response to the voltage signal at the node ND16. The second switch element T16 may be a transfer gate that is configured to output the second pre-temperature voltage signal P_VPTAT<2> as the temperature voltage signal VPTAT when the fourth control signal CON<4> is enabled. An enabled fourth control signal CON<4> has a logic "high" level. The third temperature element N14 may be a diode-like NMOS transistor where the gate of the diode-like NMOS transistor is electrically coupled to the drain of the diode-like NMOS transistor. The fourth temperature element N15 may be an NMOS transistor having a gate that is electrically coupled to the node ND16. The drain currents of the third and fourth temperature elements N14, N15 may increase or decrease as the temperature rises.

The first and second resistance controllers 1420, 1440 may be configured such that a voltage variation rate of the temperature voltage signal VPTAT when the third control signal CON<3> is enabled and the fourth control signal CON<4> disabled is relatively less than a voltage variation rate of the temperature voltage signal VPTAT when the fourth control signal CON<4> is enabled with the third control signal CON<3> disabled.

An operation of the temperature voltage generator 14 having the aforementioned configuration will be described with reference to FIG. 6 in conjunction with an example in where a level variation of the temperature voltage signal VPTAT is adjusted based on the first and second control signals CON<1:2> when the third control signal CON<3> is enabled and the fourth control signal CON<4> is disabled. In the graph shown in FIG. 6, the abscissa represents temperature values and the ordinate represents voltage levels of the temperature voltage signal VPTAT.

The operation of the temperature voltage generator 14 will be described hereinafter in conjunction with a first case where both the first and second control signals CON<1:2> are disabled and have a logic "low" level.

The node ND12 of the first pre-temperature voltage generator 141 may be pulled up by the first driver 1411 in response to the first and second control signals CON<1:2> being disabled to have a logic "low" level. The first resistance controller 1420 may divide a voltage level of the node ND12 based on the resistance values of the first and second temperature elements N12, N13 and generate the first pre-temperature voltage signal P_VPTAT<1> at the node ND15. The node ND15 may be between the first and second temperature elements N12, N13 and may output the first pre-temperature voltage signal P_VPTAT<1> as the temperature voltage signal VPTAT in response to the third control signal CON<3> being enabled.

The node ND16 of the second pre-temperature voltage generator 143 may be pulled up by the fourth driver 1431 in response to the first and second control signals CON<1:2> being disabled and having a logic "low" level. The second resistance controller 1440 may divide a voltage difference between the nodes ND16, ND15 based on the resistance values of the third and fourth temperature elements N14, N15 and generate the second pre-temperature voltage signal P_VPTAT<2> at the node ND19. The node ND19 may be between the third and fourth temperature elements N14, N15. Since the node ND15 has a level of the first pre-temperature voltage signal P_VPTAT<1>, the second pre-temperature voltage signal P_VPTAT<2> may have a level that is relatively higher than a level of the first pre-temperature voltage signal P_VPTAT<1>. In such a case, the second pre-temperature voltage signal P_VPTAT<2> is not output as the temperature voltage signal VPTAT because the fourth control signal CON<4> is disabled and has a logic "low" level.

The operation of the temperature voltage generator 14 will be described hereinafter in conjunction with a second case where the first control signal CON<1> is enabled to have a logic "high" level and the second control signal CON<2> is disabled to have a logic "low" level.

The node ND12 of the first pre-temperature voltage generator 141 may be pulled up by the first and second drivers 1411, 1412 in response to the first control signal CON<1> being enabled to have a logic "high" level and the second control signal CON<2> being disabled to have a logic "low" level. Since the node ND12 of the first pre-temperature voltage generator 141 is pulled up by the first and second drivers 1411, 1412, a drivability of the first pull-up driver 1410 may be relatively greater compared to the first case. The first resistance controller 1420 may divide a voltage level of the node ND12 based on the resistance values of the first and second temperature elements N12, N13 to generate the first pre-temperature voltage signal P_VPTAT<1> at the node ND15. The node ND15 may be between the first and second temperature elements N12, N13 and may output the first pre-temperature voltage signal P_VPTAT<1> as the temperature voltage signal VPTAT when the third control signal CON<3> is enabled. Since the drivability of the first pull-up driver 1410 is relatively greater compared to the first case, the first resistance controller 1420 may generate the temperature voltage signal VPTAT having a relatively higher level compared to the first case.

The node ND16 of the second pre-temperature voltage generator 143 may be pulled up by the fourth and fifth drivers 1431, 1432 in response to the first control signal CON<1> being enabled to have a logic "high" level and the second control signal CON<2> being disabled to have a logic "low" level. Since the node ND16 of the second pre-temperature voltage generator 143 is pulled up by the fourth and fifth drivers 1431, 1432, a drivability of the second pull-up driver 1430 may be relatively greater compared to the first case. The second resistance controller 1440 may divide a voltage difference between the nodes ND16, ND15 based on the resistance values of the third and fourth temperature elements N14, N15 and may generate the second pre-temperature voltage signal P_VPTAT<2> at the node ND19. The node ND19 may be between the third and fourth temperature elements N14, N15. Since the node ND15 has a level of the first pre-temperature voltage signal P_VPTAT<1>, the second pre-temperature voltage signal P_VPTAT<2> may have a level that is relatively higher than a level of the first pre-temperature voltage signal P_VPTAT<1>. In such a case, the second pre-temperature voltage signal P_VPTAT<2> is not output as the temperature voltage signal VPTAT in response to the fourth control signal CON<4> being disabled to have a logic "low" level.

The operation of the temperature voltage generator 14 will be described hereinafter in conjunction with a third case where both the first and second control signals CON<1:2> are enabled to have a logic "high" level.

The node ND12 of the first pre-temperature voltage generator 141 may be pulled up by the first, second and third drivers 1411, 1412, 1413 in response to the first and second control signals CON<1:2> being enabled to have a logic "high" level. Since the node ND12 of the first pre-temperature voltage generator 141 is pulled up by the first, second and third drivers 1411, 1412, 1413, a drivability of the first pull-up driver 1410 may be relatively greater compared to the second case. The first resistance controller 1420 may divide a voltage level of the node ND12 based on the resistance values of the first and second temperature elements N12, N13 to generate the first pre-temperature voltage signal P_VPTAT<1> at the node ND15. The node ND15 may be between the first and second temperature elements N12, N13 and may output the first pre-temperature voltage signal P_VPTAT<1> as the temperature voltage signal VPTAT in response to the third control signal CON<3> being enabled. Since the drivability of the first pull-up driver 1410 is relatively greater compared to the second case, the first resistance controller 1420 may generate the temperature voltage signal VPTAT having a relatively higher level compared to the second case.

The node ND16 of the second pre-temperature voltage generator 143 may be pulled up by the fourth, fifth and sixth drivers 1431, 1432, 1433 in response to the first and second control signals CON<1:2> being enabled to have a logic "high" level. Since the node ND16 of the second pre-temperature voltage generator 143 is pulled up by the fourth, fifth and sixth drivers 1431, 1432, 1433, a drivability of the second pull-up driver 1430 may be relatively greater compared to the second case. The second resistance controller 1440 may divide a voltage difference between the nodes ND16, ND15 based on the resistance values of the third and fourth temperature elements N14, N15 to generate the second pre-temperature voltage signal P_VPTAT<2> at the node ND19. The node ND19 may be between the third and fourth temperature elements N14, N15. Since the node ND15 has a level of the first pre-temperature voltage signal P_VPTAT<1>, the second pre-temperature voltage signal P_VPTAT<2> may have a level that is relatively higher than a level of the first pre-temperature voltage signal P_VPTAT<1>. In such a case, the second pre-temperature voltage signal P_VPTAT<2> is not output as the temperature voltage signal VPTAT in response to the fourth control signal CON<4> being disabled to have a logic "low" level.

As described above, the temperature voltage generator 14 may adjust a drivability for pulling up the nodes ND12, ND16 based on the first and second control signals CON<1:2> to generate the temperature voltage signal VPTAT having an adjusted level variation.

Figure 7:
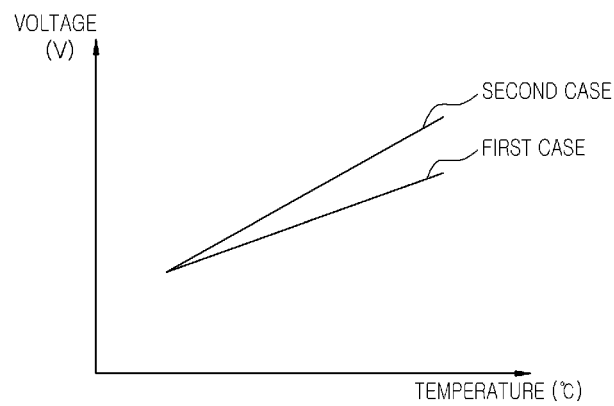
FIG. 7 is a graphical representation of voltage variation rates of a temperature voltage signal of an embodiment of a semiconductor system relative to temperature variation.

An operation of the temperature voltage generator 14 having the aforementioned configuration will be described hereinafter with reference to FIG. 7 in conjunction with an example in where a voltage variation rate of the temperature voltage signal VPTAT is adjusted based on the third and fourth control signals CON<3:4> when the first control signal CON<1> is enabled and the second control signal CON<2> is disabled. In the graph of FIG. 7, the abscissa represents temperature values and the ordinate represents voltage values of the temperature voltage signal VPTAT.

The operation of the temperature voltage generator 14 will be described hereinafter in conjunction with a first case where the third control signal CON<3> is enabled to have a logic "high" level and the fourth control signal CON<4> is disabled to have a logic "low" level.

The node ND12 of the first pre-temperature voltage generator 141 may be pulled up by the first and second drivers 1411, 1412 in response to the first control signal CON<1> being enabled and the second control signal CON<2> being disabled. The first resistance controller 1420 may divide a voltage level of the node ND12 based on the resistance values of the first and second temperature elements N12, N13 to generate the first pre-temperature voltage signal P_VPTAT<1> at the node ND15. The node ND15 may be between the first and second temperature elements N12, N13 and may output the first pre-temperature voltage signal P_VPTAT<1> as the temperature voltage signal VPTAT in response to the third control signal CON<3> being enabled to have a logic "high" level.

The node ND16 of the second pre-temperature voltage generator 143 may be pulled up by the fourth and fifth drivers 1431, 1432 in response to the first control signal CON<1> being enabled and the second control signal CON<2> being disabled. The second resistance controller 1440 may divide a voltage difference between the nodes ND16, ND15 based on the resistance values of the third and fourth temperature elements N14, N15 to generate the second pre-temperature voltage signal P_VPTAT<2> at the node ND19 The node ND19 may be between the third and fourth temperature elements N14, N15. Since the node ND15 has a level of the first pre-temperature voltage signal P_VPTAT<1>, the second pre-temperature voltage signal P_VPTAT<2> may have a level that is relatively higher than a level of the first pre-temperature voltage signal P_VPTAT<1>. In such a case, the second pre-temperature voltage signal P_VPTAT<2> is not output as the temperature voltage signal VPTAT in response to the fourth control signal CON<4> being disabled to have a logic "low" level. The temperature voltage signal VPTAT may be generated based on the resistance values of the first and second temperature elements N12, N13.

The operation of the temperature voltage generator 14 will be described hereinafter in conjunction with a second case where the third control signal CON<3> is disabled to have a logic "low" level and the fourth control signal CON<4> is enabled to have a logic "high" level.

The node ND12 of the first pre-temperature voltage generator 141 may be pulled up by the first and second drivers 1411, 1412 in response to the first control signal CON<1> being enabled to have a logic "high" level and the second control signal CON<2> being disabled to have a logic "low" level. The first resistance controller 1420 may divide a voltage level of the node ND12 based on the resistance values of the first and second temperature elements N12, N13 to generate the first pre-temperature voltage signal P_VPTAT<1> at the node ND15. The node ND15 may be between the first and second temperature elements N12, N13, and the first pre-temperature voltage signal P_VPTAT<1> is not output as the temperature voltage signal VPTAT in response to the third control signal CON<3> being disabled to have a logic "low" level.

The node ND16 of the second pre-temperature voltage generator 143 may be pulled up by the fourth and fifth drivers 1431, 1432 in response to the first control signal CON<1> being enabled to have a logic "high" level and the second control signal CON<2> being disabled to have a logic "low" level. The second resistance controller 1440 may divide a voltage difference between the nodes ND16, ND15 based on the resistance values of the third and fourth temperature elements N14, N15 to generate the second pre-temperature voltage signal P_VPTAT<2> at the node ND19. The node ND19 may be between the third and fourth temperature elements N14, N15. Since the node ND15 has a level of the first pre-temperature voltage signal P_VPTAT<1>, the second pre-temperature voltage signal P_VPTAT<2> may have a level that is relatively higher than a level of the first pre-temperature voltage signal P_VPTAT<1>. In such a case, the second pre-temperature voltage signal P_VPTAT<2> may be output as the temperature voltage signal VPTAT in response to the fourth control signal CON<4> being enabled to have a logic "high" level. Since the temperature voltage signal VPTAT is generated based on the first, second, third and fourth temperature elements N12, N13, N14, N15, a voltage variation rate of the temperature voltage signal VPTAT based on temperature variation may be relatively higher compared to the first case.

As described above, the temperature voltage generator 14 may selectively output one of the first and second pre-temperature voltage signals P_VPTAT<1:2> as the temperature voltage signal VPTAT according to the third and fourth control signals CON<3:4> to adjust the voltage variation rate of the temperature voltage signal VPTAT based on the temperature variation.

An operation of the semiconductor system having the aforementioned configuration will be described hereinafter with reference to FIGS. 1 to 7 in conjunction with an example in where a logic level combination of the first, second, third and fourth temperature code signals TCD<1:4> is consistent with a predefined logic level combination where a level variation of the temperature voltage signal VPTAT is changed from the first case into the second case in FIG. 6 and a voltage variation rate of the temperature voltage signal VPTAT is set to correspond to the second case illustrated in FIG. 7.

Figure 6:
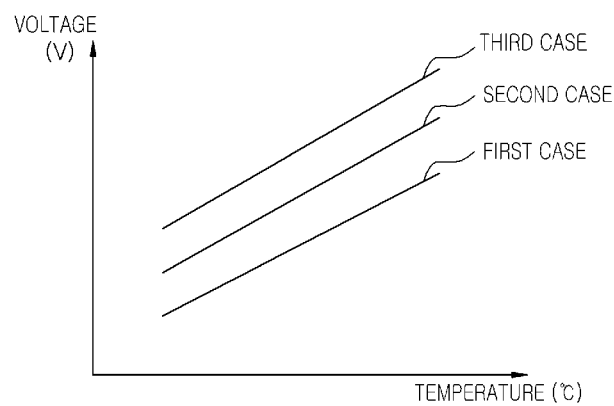
FIG. 6 is a graphical representation of various levels of a temperature voltage signal of an embodiment of a semiconductor system.

The controller 1 may receive the first, second, third and fourth temperature code signals TCD<1:4> and responsively transmit the first, second and third mode set signals MRS<1:3> to the semiconductor device 2 when the temperature voltage signal VPTAT has a level variation of the first case illustrated in FIG. 6 and has a voltage variation rate of the second case illustrated in FIG. 7.

The temperature sensor 10 of the semiconductor device 2 may receive the first, second and third mode set signals MRS<1:3> and responsively increase a voltage level of the temperature voltage signal VPTAT. The temperature voltage signal VPTAT may be adjusted to have the voltage level of the second case illustrated in FIG. 6 and may be set to have the voltage variation rate of the second case illustrated in FIG. 7. In addition, the temperature sensor 10 may generate the reference voltage signal VREF having a relatively constant voltage level. The code generator 20 may compare the temperature voltage signal VPTAT with the reference voltage signal VREF to generate the first, second, third and fourth code signals CD<1:4>. The register 30 may store the first, second, third and fourth code signals CD<1:4> and may output the first, second, third and fourth code signals CD<1:4> as the first, second, third and fourth internal code signals ICD<1:4>, respectively. The output buffer 40 may buffer the first, second, third and fourth internal code signals ICD<1:4> and output the buffered first, second, third and fourth internal code signals ICD<1:4> as the first, second, third and fourth temperature code signals TCD<1:4>, respectively.

The controller 1 may receive the first, second, third and fourth temperature code signals TCD<1:4> and does not transmit the first, second and third mode set signals MRS<1:3> to the semiconductor device 2 when the temperature voltage signal VPTAT has a level variation of the second case illustrated in FIG. 6 and has a voltage variation rate of the second case illustrated in FIG. 7.

The temperature sensor 10 of the semiconductor device 2 does not adjust a voltage level and a voltage variation rate of the temperature voltage signal VPTAT because the first, second and third mode set signals MRS<1:3> are not applied to the temperature sensor 10. The temperature sensor 10 may still generate the reference voltage signal VREF having a relatively constant voltage level. The code generator 20 may compare the temperature voltage signal VPTAT with the reference voltage signal VREF to generate the first, second, third and fourth code signals CD<1:4>. The register 30 may store the first, second, third and fourth code signals CD<1:4> and may output the first, second, third and fourth code signals CD<1:4> as the first, second, third and fourth internal code signals ICD<1:4>, respectively. The output buffer 40 may buffer the first, second, third and fourth internal code signals ICD<1:4> and may output the buffered first, second, third and fourth internal code signals ICD<1:4> as the first, second, third and fourth temperature code signals TCD<1:4>, respectively. The semiconductor device 2 may output the first, second, third and fourth temperature code signals TCD<1:4> having an unchanged logic level combination in response to the first, second and third mode set signals MRS<1:3> not being applied to the temperature sensor 10.

As described above, various embodiments of a semiconductor system may adjust a level variation and a voltage variation rate of a temperature voltage signal whose level changes according to temperature variation and may generate a temperature code signal from the temperature voltage signal whose level variation and voltage variation rate are adjusted and may to improve the relative reliability of information on the temperature variation. The semiconductor system may compensate for relative temperature differences between a controller and a semiconductor device of the semiconductor system.

Figure 8:
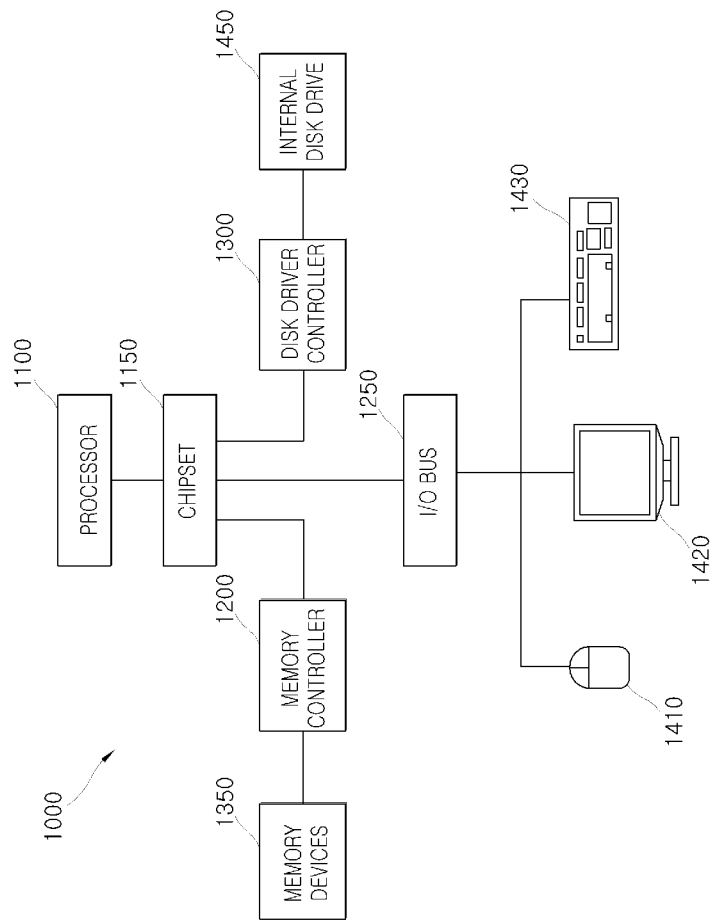
FIG. 8 is a block diagram representation of a system including an embodiment of the semiconductor system.

Referring to FIG. 8, a block diagram representation of a system 1000 including an embodiment of a controller 1 and an embodiment of a semiconductor device 2 is shown. The system 1000 includes one or more semiconductor memory devices 1350 and a memory controller 1200. In an embodiment, the controller 1 is substantially similar to the memory controller 1200. In an embodiment, the semiconductor device 2 is substantially similar to the semiconductor memory device 1350.

In an embodiment, a semiconductor system includes a controller 1200 and a semiconductor device 1350. The controller 1200 is suitable for receiving a temperature code signal and responsively generating a mode set signal operable to adjust a level variation and a voltage variation rate of a temperature voltage signal, wherein the temperature voltage signal level varies according to temperature when a logic level combination of the temperature code signal is different from a predefined logic level combination. The semiconductor device 1350 is suitable for generating the temperature voltage signal from a drivability and a resistance value set by the mode set signal and is suitable for generating a temperature code signal based on a comparison of the temperature voltage signal and a reference voltage signal.

In an embodiment, a semiconductor device 1350 includes a temperature sensor, a code generator, a register and an output buffer. The temperature sensor is suitable for receiving a mode set signal operable to adjust a level variation and a voltage variation rate of a temperature voltage signal to generate the temperature voltage signal and for generating a reference voltage signal having a relatively constant voltage level, the temperature voltage signal being generated by adjusting a drivability and a resistance value of the temperature sensor in response to the mode set signal. The code generator is suitable for generating a code signal based on a comparison of the temperature voltage signal and the reference voltage signal. The register suitable for storing the code signal and suitable for outputting the code signal as an internal code signal. The output buffer suitable for buffering the internal code signal and generating the buffered internal code signal as the temperature code signal. The level variation of the temperature voltage signal is adjusted based on the drivability of the temperature sensor and the voltage variation rate of the temperature voltage signal is adjusted based on the resistance value of the temperature sensor.

Examples of the semiconductor memory device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 8 is merely one example of a system employing a semiconductor memory device 1350. In alternate embodiments, such as cellular phones or digital cameras, the components may differ from the embodiment shown in FIG. 8.

While certain embodiments have been described above, it will be understood to those skilled in the art that the embodiments described are by way of example only. Accordingly, the semiconductor system described herein should not be limited based on the described embodiments. Rather, the semiconductor system described herein should only be limited in light of the claims that follow when taken in conjunction with the above description and accompanying drawings.

What is claimed is:

1. A semiconductor system comprising:
    a controller suitable for receiving a temperature code signal and responsively generating a mode set signal operable to adjust a level variation and a voltage variation rate of a temperature voltage signal, wherein the temperature voltage signal level varies according to temperature when a logic level combination of the temperature code signal is different from a predefined logic level combination; and
    a semiconductor device suitable for generating the temperature voltage signal from a drivability and a resistance value set by the mode set signal and suitable for generating the temperature code signal based on a comparison of the temperature voltage signal and a reference voltage signal.

2. The semiconductor system of claim 1,
    wherein the level variation of the temperature voltage signal is adjusted based on the drivability; and
    wherein the voltage variation rate of the temperature voltage signal is adjusted based on the resistance value.

3. The semiconductor system of claim 1, wherein the semiconductor device comprises:
    a temperature sensor suitable for adjusting the drivability and the resistance value of the temperature sensor in response to the mode set signal to generate the temperature voltage signal and to generate the reference voltage signal having a relatively constant voltage level;
    a code generator suitable for generating a code signal based on a comparison of the temperature voltage signal and the reference voltage signal;
    a register suitable for storing the code signal and suitable for outputting the code signal as an internal code signal; and
    an output buffer suitable for generating a buffered internal code signal as the temperature code signal.

4. The semiconductor system of claim 3,
    wherein the mode set signal comprises a first mode set signal, a second mode set signal and a third mode set signal; and
    wherein the temperature sensor comprises:
    a control signal generator suitable for decoding the first, second and third mode set signals to generate first, second, third and fourth control signals;
    a drive signal generator suitable for generating a drive signal having a relatively constant level regardless of temperature variation;
    a reference voltage generator suitable for generating the reference voltage signal in response to the drive signal; and
    a temperature voltage generator suitable for adjusting the drivability and the resistance value of the temperature voltage generator in response to the drive signal and the first, second, third and fourth control signals to generate the temperature voltage signal.

5. The semiconductor system of claim 4, wherein the temperature voltage generator comprises:

a first pre-temperature voltage generator suitable for adjusting a drivability of the first pre-temperature voltage generator in response to the first and second control signals to generate a first pre-temperature voltage signal having a level that varies according to temperature and suitable for outputting the first pre-temperature voltage signal as the temperature voltage signal in response to the third control signal; and a second pre-temperature voltage generator suitable for adjusting a drivability of the second pre-temperature voltage generator in response to the first and second control signals to generate a second pre-temperature voltage signal having a level that varies according to temperature and suitable for outputting the second pre-temperature voltage signal as the temperature voltage signal in response to the fourth control signal.

6. The semiconductor system of claim 5, wherein the first pre-temperature voltage generator comprises:

a first pull-up driver suitable for pulling up a first node in response to the drive signal, a drivability of the first pull-up driver to pull up the first node being adjusted controlled according to a logic level combination of the first and second control signals; and a first resistance controller suitable for generating the first pre-temperature voltage signal according to resistance values of first and second temperature elements, wherein the first and second temperature elements are electrically coupled in series between the first node and a ground voltage terminal and suitable for outputting the first pre-temperature voltage signal as the temperature voltage signal when the third control signal is enabled.

7. The semiconductor system of claim 6, wherein the first pull-up driver comprises:

a first driver suitable for pulling up the first node in response to the drive signal;

a second driver suitable for pulling up the first node in response to the drive signal when the first control signal is enabled; and a third driver suitable for pulling up the first node in response to the drive signal when the second control signal is enabled.

8. The semiconductor system of claim 6, wherein the first resistance controller comprises the first temperature element, the second temperature element and a first switch element;

wherein the first temperature element is electrically coupled between the first node and a second node, wherein the first pre-temperature voltage signal is output via the second node, and a gate of the first temperature element is electrically coupled to the first node;

wherein the second temperature element is electrically coupled between the second node and the ground voltage terminal, and a gate of the second temperature element is electrically coupled to the first node; and wherein the first switch element outputs the first pre-temperature voltage signal as the temperature voltage signal when the third control signal is enabled.

9. The semiconductor system of claim 5, wherein the second pre-temperature voltage generator comprises:

a second pull-up driver suitable for pulling up a third node in response to the drive signal, a drivability of the second pull-up driver to pull up the third node being adjusted according to a logic level combination of the first and second control signals; and a second resistance controller suitable for generating the second pre-temperature voltage signal based on resistance values of third and fourth temperature elements, wherein the third and fourth temperature elements are electrically coupled in series between the third node and a ground voltage terminal and suitable for outputting the second pre-temperature voltage signal as the temperature voltage signal when the fourth control signal is enabled.

10. The semiconductor system of claim 9, wherein the second pull-up driver comprises:

a fourth driver suitable for pulling up the third node in response to the drive signal;

a fifth driver suitable for pulling up the third node in response to the drive signal when the first control signal is enabled; and a sixth driver suitable for pulling up the third node in response to the drive signal when the second control signal is enabled.

11. The semiconductor system of claim 9, wherein the second resistance controller comprises the third temperature element, the fourth temperature element and a second switch element;

wherein the third temperature element is electrically coupled between the third node and a fourth node, wherein the second pre-temperature voltage signal is output via the fourth node, and a gate of the third temperature element is electrically coupled to the third node;

wherein the fourth temperature element is electrically coupled between the fourth node and a second node, wherein the first pre-temperature voltage signal is output via the second node, and a gate of the fourth temperature element is electrically coupled to the third node; and wherein the second switch element outputs the second pre-temperature voltage signal as the temperature voltage signal when the fourth control signal is enabled.

12. A semiconductor device comprising:

a temperature sensor suitable for receiving a mode set signal operable to adjust a level variation and a voltage variation rate of a temperature voltage signal to generate the temperature voltage signal and for generating a reference voltage signal having a relatively constant voltage level, the temperature voltage signal being generated by adjusting a drivability and a resistance value of the temperature sensor in response to the mode set signal;

a code generator suitable for generating a code signal based on a comparison of the temperature voltage signal and the reference voltage signal;

a register suitable for storing the code signal and suitable for outputting the code signal as an internal code signal; and an output buffer suitable for buffering the internal code signal and generating the buffered internal code signal as a temperature code signal, wherein the level variation of the temperature voltage signal is adjusted based on the drivability of the temperature sensor and the voltage variation rate of the temperature voltage signal is adjusted based on the resistance value of the temperature sensor.

13. The semiconductor device of claim 12, wherein the mode set signal comprises a first mode set signal, a second mode set signal and a third mode set signal; and wherein the temperature sensor comprises:

a control signal generator suitable for decoding the first, second and third mode set signals to generate first, second, third and fourth control signals;

a drive signal generator suitable for generating a drive signal having a relatively constant level regardless of temperature variation;

a reference voltage generator suitable for generating the reference voltage signal in response to the drive signal; and a temperature voltage generator suitable for adjusting the drivability and the resistance value of the temperature generator in response to the drive signal and the first, second, third and fourth control signals to generate the temperature voltage signal.

14. The semiconductor device of claim 13, wherein the temperature voltage generator comprises:

a first pre-temperature voltage generator suitable for adjusting a drivability of the first pre-temperature voltage generator in response to the first and second control signals to generate a first pre-temperature voltage signal, wherein a level of the first pre-temperature voltage signal varies according to temperature and suitable for outputting the first pre-temperature voltage signal as the temperature voltage signal in response to the third control signal; and a second pre-temperature voltage generator suitable for adjusting a drivability of the second pre-temperature voltage generator in response to the first and second control signals to generate a second pre-temperature voltage signal, wherein a level of the second pre-temperature voltage signal varies according to temperature and suitable for outputting the second pre-temperature voltage signal as the temperature voltage signal in response to the fourth control signal.

15. The semiconductor device of claim 14, wherein the first pre-temperature voltage generator comprise:

a first pull-up driver suitable for pulling up a first node in response to the drive signal, a drivability of the first pull-up driver to pull up the first node being adjusted according to a logic level combination of the first and second control signals; and a first resistance controller suitable for generating the first pre-temperature voltage signal according to resistance values of first and second temperature elements, wherein the first and second temperature elements are electrically coupled in series between the first node and a ground voltage terminal and suitable for outputting the first pre-temperature voltage signal as the temperature voltage signal when the third control signal is enabled.

16. The semiconductor device of claim 15, wherein the first pull-up driver comprises:

a first driver suitable for pulling up the first node in response to the drive signal;

a second driver suitable for pulling up the first node in response to the drive signal when the first control signal is enabled; and a third driver suitable for pulling up the first node in response to the drive signal when the second control signal is enabled.

17. The semiconductor device of claim 15, wherein the first resistance controller comprises the first temperature element, the second temperature element and a first switch element;

wherein the first temperature element is electrically coupled between the first node and a second node, wherein the first pre-temperature voltage signal is output via the second node, and a gate of the first temperature element is electrically coupled to the first node;

wherein the second temperature element is electrically coupled between the second node and the ground voltage terminal, and a gate of the second temperature element is electrically coupled to the first node; and wherein the first switch element outputs the first pre-temperature voltage signal as the temperature voltage signal when the third control signal is enabled.

18. The semiconductor device of claim 14, wherein the second pre-temperature voltage generator comprises:

a second pull-up driver suitable for pulling up a third node in response to the drive signal, a drivability of the second pull-up driver to pull up the third node being adjusted according to a logic level combination of the first and second control signals; and a second resistance controller suitable for generating the second pre-temperature voltage signal according to resistance values of third and fourth temperature elements, wherein the third and fourth temperature elements are electrically coupled in series between the third node and a ground voltage terminal and suitable for outputting the second pre-temperature voltage signal as the temperature voltage signal when the fourth control signal is enabled.

19. The semiconductor device of claim 18, wherein the second pull-up driver comprises:

a fourth driver suitable for pulling up the third node in response to the drive signal;

a fifth driver suitable for pulling up the third node in response to the drive signal when the first control signal is enabled; and a sixth driver suitable for pulling up the third node in response to the drive signal when the second control signal is enabled.

20. The semiconductor device of claim 18, wherein the second resistance controller comprises the third temperature element, the fourth temperature element and a second switch element;

wherein the third temperature element is electrically coupled between the third node and a fourth node, wherein the second pre-temperature voltage signal is output via the fourth node, and a gate of the third temperature element is electrically coupled to the third node;

wherein the fourth temperature element is electrically coupled between the fourth node and a second node, wherein the first pre-temperature voltage signal is output via the second node, and a gate of the fourth temperature element is electrically coupled to the third node; and wherein the second switch element outputs the second pre-temperature voltage signal as the temperature voltage signal when the fourth control signal is enabled.

* * * * *